(12) United States Patent
Wang et al.

(10) Patent No.: US 11,147,172 B2
(45) Date of Patent: Oct. 12, 2021

(54) DISPLAY DEVICE

(71) Applicant: E Ink Holdings Inc., Hsinchu (TW)

(72) Inventors: Hsing-Kai Wang, Hsinchu (TW);
Yung-Sheng Chang, Hsinchu (TW);
Chia-Chun Yeh, Hsinchu (TW);
Yi-Sheng Lin, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 16/892,314

(22) Filed: Jun. 4, 2020

(65) Prior Publication Data

US 2021/0037662 A1 Feb. 4, 2021

(30) Foreign Application Priority Data

Aug. 1, 2019 (TW) .................. 108127410

(51) Int. Cl.
*H05K 5/00* (2006.01)
*G06F 3/041* (2006.01)
*H05K 5/02* (2006.01)

(52) U.S. Cl.
CPC ........... *H05K 5/0017* (2013.01); *G06F 3/041* (2013.01); *H05K 5/0226* (2013.01); *G06F 2203/04102* (2013.01)

(58) Field of Classification Search
CPC .......... G06F 3/041; G06F 2203/04102; H05K 5/0017; H05K 5/0226; H05K 1/0259; G09G 3/20; G09G 2300/0426; G09G 2310/027; G09G 2310/0275; G09G 2320/0204; G09G 2330/02; G09G 2330/028; G09G 2330/04; G09G 2330/06; G09G 3/3696; H01L 23/60; H01L 27/0255; H01L 27/0296; H01L 27/0248; H01L 27/0292
See application file for complete search history.

(56) References Cited

U.S. PATENT DOCUMENTS

| 9,086,850 B2 | 7/2015 | Verschoor et al. |
| 9,201,531 B2 | 12/2015 | Hsieh et al. |
| 9,235,239 B2 | 1/2016 | van Dijk et al. |
| 2013/0037228 A1 | 2/2013 | Verschoor et al. |

(Continued)

FOREIGN PATENT DOCUMENTS

| TW | I563360 B | 12/2016 |
| TW | 201901342 A | 1/2019 |
| TW | 201911614 A | 3/2019 |

OTHER PUBLICATIONS

Corresponding Taiwan office action dated Sep. 24, 2020.

*Primary Examiner* — Nelson M Rosario
(74) *Attorney, Agent, or Firm* — CKC & Partners Co., LLC

(57) ABSTRACT

A display device includes an array substrate and two electronic ink layers. The array substrate includes two active regions and a folding region that connects these two active regions. The two active regions are located at two opposite sides of the folding region. The two electronic ink layers are respectively located on the two active regions. The folding region of the array substrate is located below a gap between the two electronic ink layers. When the display device is at an unfolded state, two edges of the two electronic ink layers are adjacent to each other. When the display device is at a folded state, the two electronic ink layers are located between the two active regions of the array substrate.

19 Claims, 12 Drawing Sheets

(56) References Cited

U.S. PATENT DOCUMENTS

| | | | |
|---|---|---|---|
| 2015/0277496 A1* | 10/2015 | Reeves | G06F 3/1438 |
| | | | 345/1.2 |
| 2017/0060188 A1 | 3/2017 | Han et al. | |
| 2017/0307929 A1 | 10/2017 | Nakazawa et al. | |
| 2017/0373121 A1 | 12/2017 | Leng et al. | |
| 2018/0097197 A1 | 4/2018 | Han et al. | |
| 2018/0217639 A1* | 8/2018 | Jones | G06F 1/1652 |
| 2020/0142447 A1* | 5/2020 | Yoon | G06F 1/1626 |

\* cited by examiner

DISPLAY DEVICE

CROSS-REFERENCE TO RELATED APPLICATION

This application claims priority to Taiwan Application Serial Number 108127410, filed Aug. 1, 2019, which is herein incorporated by reference in its entirety.

BACKGROUND

Field of Invention

The present invention relates to a display device. More particularly, the present invention relates to a foldable display device.

Description of Related Art

The folding region of a foldable display panel nowadays may have the arc deformation problem after long time bending. The arc deformation may be due to the material creep, and it can cause the degradation of the display quality. Furthermore, when the bending radius of the foldable display becomes smaller, the arc deformation problem may become more serious.

SUMMARY

An aspect of the present disclosure is to provide a light guide module.

According to some embodiments of the disclosure, the display device includes an array substrate and two electronic ink layers. The array substrate includes two active regions and a folding region connecting the two active regions, and the two active regions are located at two opposite sides of the folding region. The two electronic ink layers are respectively located on the two active regions, and the folding region of the array substrate is located below a gap between the two electronic ink layers. When the display device is at an unfolded state, two edges of the two electronic ink layers close to the gap are adjacent to each other, and when the display device is at a folded state, the two electronic ink layers are located between the two active regions of the array substrate.

In some embodiments of the disclosure, the display device further includes a first protection layer covering the array substrate and the two electronic ink layers.

In some embodiments of the disclosure, the first protection layer includes a folding region, and when the display device is at the unfolded state, the folding region of the first protection layer is located below the two electronic ink layers and the two active regions of the array substrate.

In some embodiments of the disclosure, the first protection layer includes two flat regions respectively overlapped with the two electronic ink layers, and when the display device is at the unfolded state, the two flat regions are in contact with each other and form a continuous surface.

In some embodiments of the disclosure, the display device further includes a second protection layer, and the array substrate is located between the two electronic ink layers and the second protection layer.

In some embodiments of the disclosure, the second protection layer includes two flat regions respectively overlapped with the two electronic ink layers, and the two flat regions are separated from each other.

In some embodiments of the disclosure, the second protection layer includes two flat regions and a folding region connecting the two flat regions, the two flat regions are respectively overlapped with the two electronic ink layers, and when the display device is at the unfolded state, the folding region of the second protection layer is located below the two flat regions of the second protection layer.

In some embodiments of the disclosure, the display device further includes a first protection layer and a second protection layer. The first protection layer includes a folding region. The second protection layer includes a folding region, and the folding region of the first protection layer is overlapped with the folding region of the second protection layer.

In some embodiments of the disclosure, the display device further includes two support frames located above the array substrate and respectively overlapping the two active regions of the array substrate. When the display device is at the unfolded state, the two first side walls of the two support frames are adjacent to each other, and the folding region of the array substrate is located below the two support frames.

In some embodiments of the disclosure, when the display device is at the folded state, the two active regions of the substrate array and the two electronic ink layers are located between the two support frames.

In some embodiments of the disclosure, each of the two first side walls of the two support frames has a chamfer in a range from 0.5 mm to 1 mm.

In some embodiments of the disclosure, the display device further includes two adhesive layers respectively located between the second protection layers and the two support frames, and the two adhesive layers are respectively conformal to the two chamfers of the two first side walls of the two support frames.

In some embodiments of the disclosure, the two edges of the two electronic ink layers are respectively conformal to the two chamfers of the two first side walls of the two support frames.

In some embodiments of the disclosure, each of the two support frames has a second side wall facing the first side wall, and when the display device is at the folded state, a distance between the two first side walls is greater than a distance between the two second side walls.

In some embodiments of the disclosure, the display device further includes a housing including a sliding groove set, and the two support frames are slidably disposed on the sliding groove set of the housing.

In some embodiments of the disclosure, when the display device is at the folded state, the two electronic ink layers are substantially parallel with each other.

In some embodiments of the disclosure, the display device further includes at least one writing sensor located below the array substrate.

In some embodiments of the disclosure, a number of the at least one writing sensor is two, and the two writing sensors are respectively overlap with the two active regions of the array substrate.

In some embodiments of the disclosure, the display device further includes at least one touch sensing layer located above the two electronic ink layers.

In some embodiments of the disclosure, a number of the at least one touch sensing layer is two, and the two touching sensing layers are respectively overlap with the two active regions of the array substrate.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
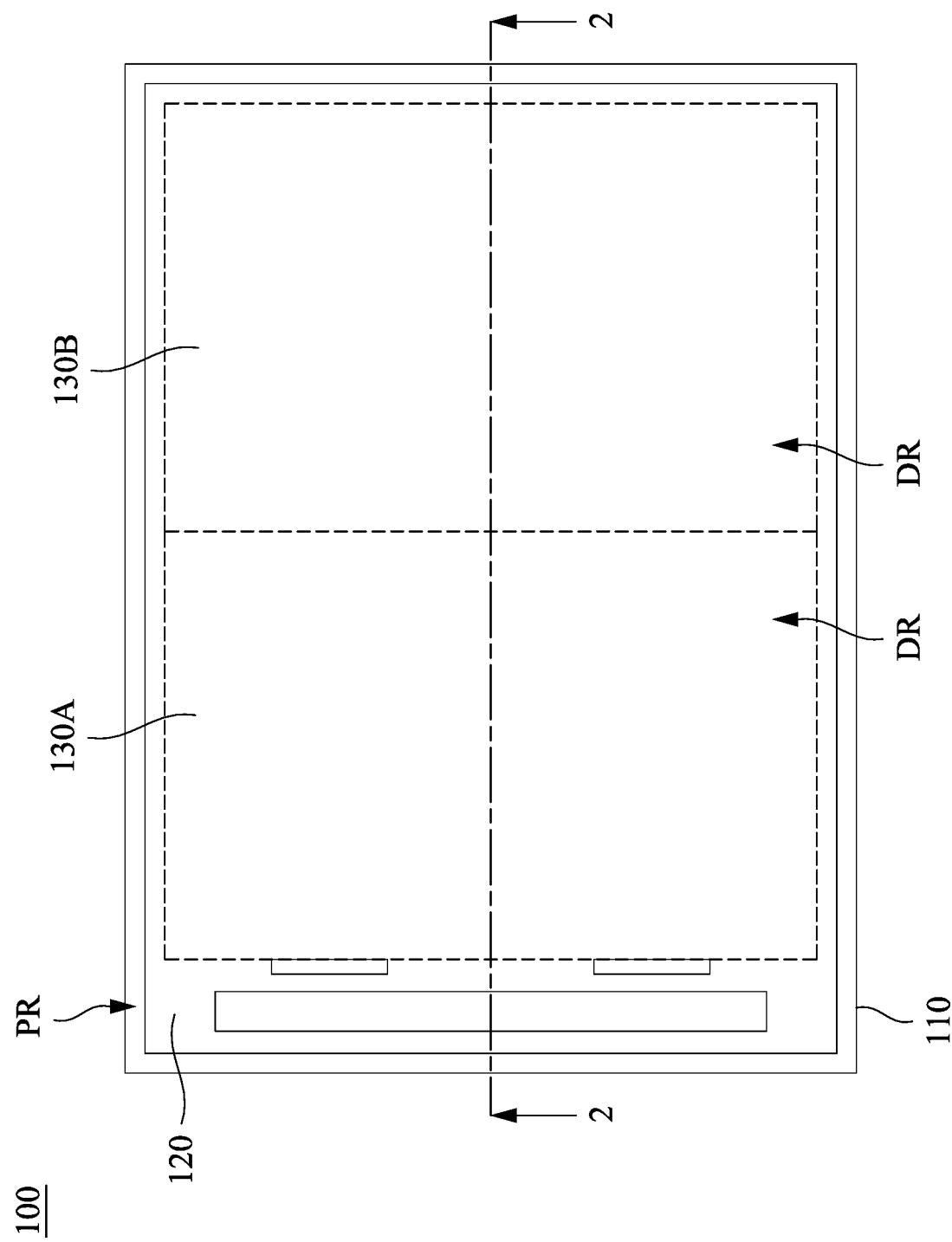
FIG. 1 is a top view of a display device at an unfolded state according to one embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

Figure 2:
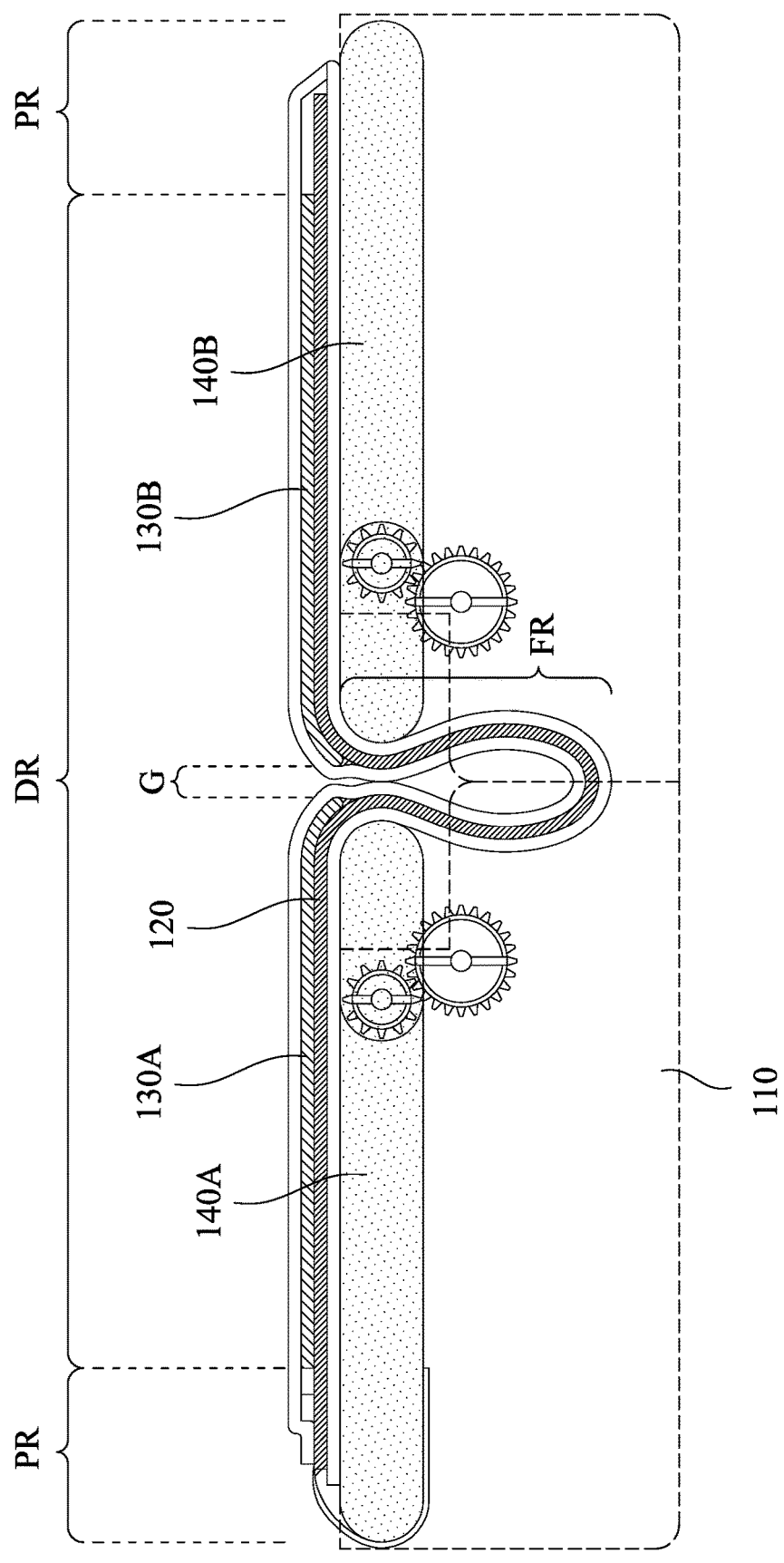
FIG. 2 is a cross-sectional view of the display device in FIG. 1 taken along the line 2-2.

FIG. 1 is a top view of a display device 100 at an unfolded state according to one embodiment of the present disclosure. FIG. 2 is a cross-sectional view of the display device 100 in FIG. 1 taken along the line 2-2. Reference is made to FIG. 1 and FIG. 2. The display device 100 includes a housing 110, an array substrate 120, two electronic ink layers 130A, 130B, and two support frames 140A, 140B. The housing 110 surrounds the two support frames 140A, 140B. The array substrate 120 is located between the two support frames 140A, 140B and the two electronic ink layers 130A, 130B, and the array substrate 120 is in contact with the two electronic ink layers 130A, 130B. The array substrate 120 includes driving circuit configured to drive the electrodes (not shown) at the two opposite sides of the two electronic ink layers 130A, 1308 to display pictures.

The display device 100 includes a periphery region PR, a display region DR and a folding region FR. The folding region FR is located below the periphery region PR and the display region DR. The display regions DR is a region that is spliced by the two electronic ink layers 130A, 130B. As shown in FIG. 2, the display device 100 is at an unfolded state, that is, the state when the display device 100 is used for displaying pictures. The periphery region PR surrounds the display region DR, for example, the range where the housing 110 surrounding the two electronic ink layers 130A, 130B, a part of the array substrate 120, and a part of the two support frames 140A, 140B are located. The folding region FR is located below a gap G between the two electronic ink layers 130A, 130B. The two support frames 140A, 140B are overlapped with the display region DR and a part of the periphery region PR of the display device 100.

Accordingly, the display device 100 of the present disclosure may drive the two electronic ink layers 130A, 130B by the driving circuit on the array substrate 120, and two electronic ink layers 130A, 130B can be spliced to form the display region DR at the unfolded state. Therefore, there is no need to use two array substrates 120, and it can avoid increasing the fabrication cost.

Figure 3:
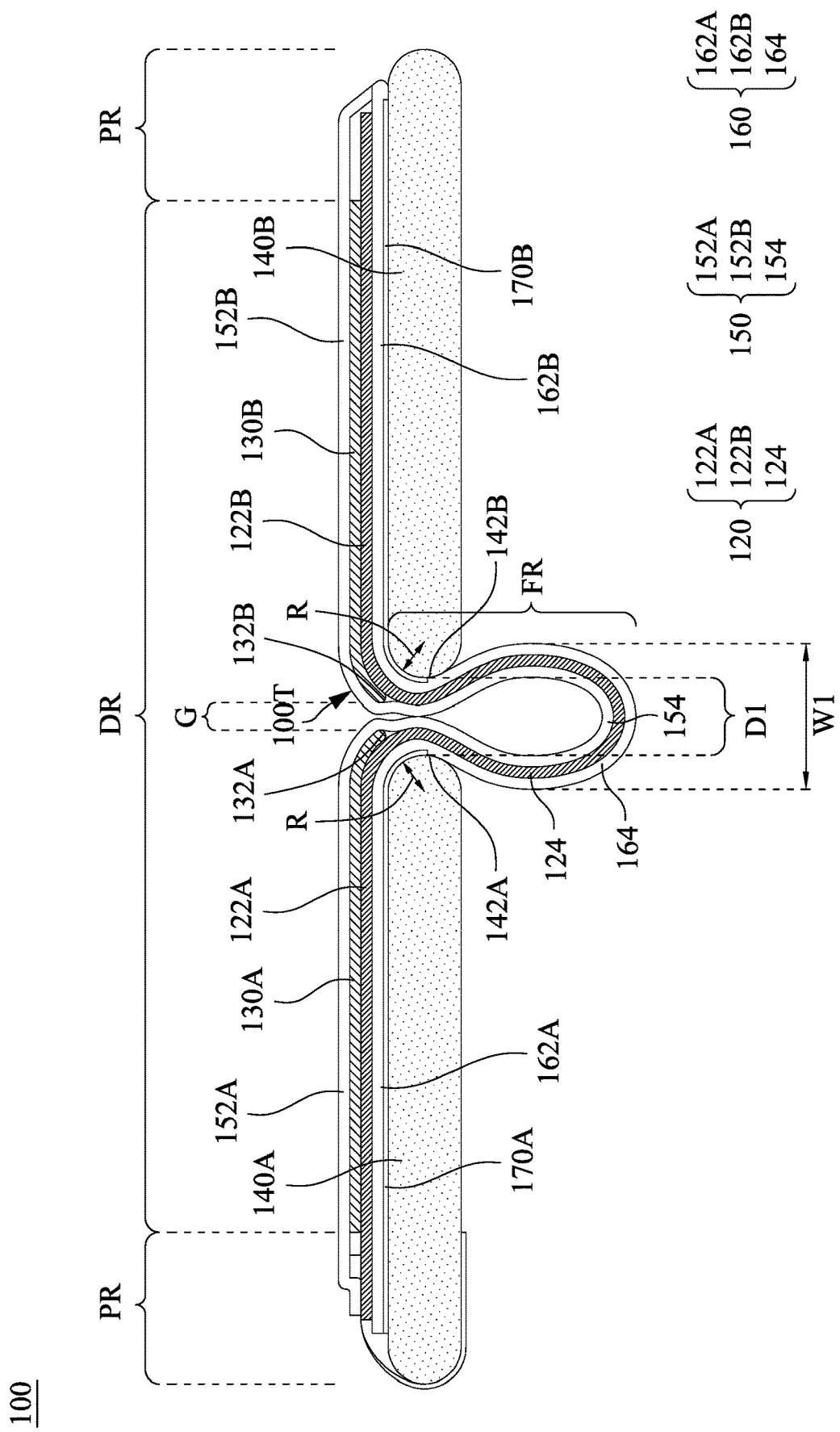
FIG. 3 is a cross-sectional view of the display device in FIG. 2 after the housing is removed.

FIG. 3 is a cross-sectional view of the display device 100 in FIG. 2 after the housing 110 is removed. Reference is made to FIG. 2 and FIG. 3, the array substrate 120 includes two active regions 122A, 122B and a folding region 124 connecting the two active regions 122A, 122B. The two active regions 122A, 122B are located at two opposite sides of the folding region 124 and are overlapped with the display region DR of the display device 100. In other words, a projection of the two active regions 122A, 122B of the array substrate 120 on the support frames 140A, 140B is overlapped with the display region DR. The folding region 124 of the array substrate 120 is bent continuously from the two active regions 122A, 122B to the folding region FR of the display device 100. In other words, the folding region 124 of the array substrate 120 is located below the gap G between the two electronic ink layers 130A, 130B.

The two electronic ink layers 130A, 130B are respectively located on the two active regions 122A, 122B, and are overlapped with the display region DR of the display device 100. In other words, a projection of the two electronic ink layers 130A, 130B is also overlapped with the display region DR. Furthermore, the two electronic ink layers 130A, 1308 are respectively in contact with the two active regions 122A, 122B of the array substrate 120. The two electronic ink layers 130A, 130B respectively have two edges 132A, 132B close to the gap G, and the edges 132A, 132B are adjacent to each other. In other words, when the display device 100 is at the unfolded state, the two edges 132A, 1328 of the two electronic ink layers 130A, 130B are adjacent to each other and are spliced to form the display region DR. In some embodiments, the gap G is in a range from 1 um to 3 um. If the gap G between the two electronic ink layers 130A, 130B is smaller than 1 um, the circuit structure in the array substrate 120 may suffer from stress. If the gap G between the two electronic ink layers 130A, 130B is greater than 3 um, the splicing efficiency of the display region DR of the display device 100 may not be good enough. Accordingly, the configuration of the two electronic ink layers 130A, 130B of the display device 100 may prevent the circuit structure in the array substrate 120 from stress while maintain the splicing integrity of the display region DR.

The two support frames 140A, 140B are respectively overlapped with the two active regions 122A, 122B of the array substrate 120 and with the two electronic ink layers 130A, 130B. The two support frames 140A, 140B respectively have first side walls 142A, 142B. The two first side walls 142A, 142B are adjacent to each other and have a distance D1 therebetween. The folding region 124 of the array substrate 120 is located below the two support frames 140A, 140B. In other words, when the display device 100 is at the unfolded state, the two first side walls 142A, 142B of the two support frames 140A, 140B are close to each other, such that the overlying two electronic ink layers 130A, 130B may be spliced to form the display region DR to shield the underlying folding region 124 of the array substrate 120.

The display device 100 further includes a first protection layer 150. The first protection layer 150 covers the array substrate 120 and the two electronic ink layers 130A, 130B. In the present embodiment, the first protection layer 150 is in contact with the two electronic ink layers 130A, 130B, but it is not limited in this regard. The first protection layer includes two flat regions 152A, 152B and a folding region 154 connecting the two flat regions 152A, 152B, and the two flat regions 152A, 152B are located at two opposite sides of the folding region 154. The two flat regions 152A, 152B of the first protection layer 150 are respectively overlapped with the two active regions 122A, 122B of the array substrate 120 and the two electronic ink layers 130A, 130B. The two flat regions 152A, 152B are in contact with each other and form a continuous surface 100T. In other words, a projection of the two flat regions 152A, 152B of the first protection layer 150 on the support frames 140A, 140B is overlapped with the display region DR. The folding region 154 of the first protection layer 150 is located below the two electronic ink layers 130A, 130B and the two active regions 122A, 122B of the array substrate 120. Specifically, the folding region 154 of the first protection layer 150 is bent continuously from the two flat regions 152A, 152B of the first protection layer 150 to the folding region FR of the display device 100, and extends below the two support frames 140A, 140B. As shown in FIG. 3, the folding region 154 of the first protection layer 150 is located below the gap G between the two electronic ink layers 130A, 130B. The folding region 154 of the first protection layer 150 is in contact with and overlapped with the folding region 124 of the array substrate 120.

The display device 100 further includes a second protection layer 160, and the array substrate 120 is located between the two electronic ink layers 130A, 130B and the second protection layer 160. The second protection layer 160 includes two flat regions 162A, 162B and a folding region 164 connecting the two flat regions 162A, 162B, and the two flat regions 162A, 162B are located at two opposite sides of the folding region 164. The two flat regions 162A, 162B of the second protection layer 160 are respectively overlapped with the two active regions 122A, 122B of the array substrate 120 and the two electronic ink layers 130A, 130B. A projection of the two flat regions 162A, 162B of the second protection layer 160 on the support frames 140A, 140B is overlapped with the display region DR. The folding region 164 of the second protection layer 160 is located below two flat regions 162A, 162B of the second protection layer 160. Specifically, the folding region 164 of the second protection layer 160 is bent continuously from the two flat regions 162A, 162B of the second protection layer 160 to the folding region FR of the display device 100, and extends below the two support frames 140A, 140B. As shown in FIG. 3, the folding region 164 of the second protection layer 160 is located below the gap G between the two electronic ink layers 130A, 130B. The folding region 164 of the second protection layer 160 is in contact with and overlapped with the folding region 124 of the array substrate 120. The folding region 164 of the second protection layer 160 is overlapped with the folding region 154 of the first protection layer 150, and the folding region 154 of the first protection layer 150 and the folding region 164 of the second protection layer 160 are separated by the folding region 124 of the array substrate 120.

Accordingly, since the two electronic ink layers 130A, 130B are not overlapped with the folding region FR, the two electronic ink layers 130A, 130B used for displaying pictures would not be bent. Therefore, the arc deformation due to material creep after long time bending can be avoided, and the display quality of the display device 100 can be improved.

Furthermore, thinning of the folding region may be achieved by surrounding the two sides of the folding region 124 of the array substrate 120 by using the first protection layer 150 and the second protection layer 160, while making the two electronic ink layers 130A, 130B not to be overlapped with the folding region FR. Such configuration would benefit the bending of the folding region 124 of the array substrate 120, the folding region 154 of the first protection layer 150, and the folding region 164 of the second protection layer 160 within the housing 110.

Each of the two first side walls 142A, 142B of the two support frames 140A, 140B has a chamfer R in a range from 0.5 mm to 1 mm. The display device 100 further includes two adhesive layers 170A, 170B respectively located between the two second protection layers 160 and the two support frames 140A, 140B. The two adhesive layers 170A, 170B are respectively conformal to the two chamfers R of the two first side walls 142A, 142B of the two support frames 140A, 140B. In other words, the two adhesive layers 170A, 170B are in contact with and overlapped with the two flat regions 162A, 162b of the second protection layer 160. The two adhesive layers 170A, 170B extend to cover the two first side walls 142A, 142B of the two support frames 140A, 140B. As shown in FIG. 3, the two adhesive layers 170A, 170B covers about a half of the two first side walls 142A, 142B, that is, a range of 90 degrees of the two first side walls 142A, 142B that form the chamfer R. The two edges 132A, 132B of the two electronic ink layers 130A, 130B are respectively conformal to the two chamfers R of the two first side walls 142A, 142B of the two support frames 140A, 140B. With such configuration, the gap G between the two electronic ink layers 130A, 130B can be reduced.

Specifically, the portions of the two adhesive layers 170A, 170B that are conformal to the chamfers R may respectively make the boundary between the two flat region s 162A, 162B of the second protection layer 160 and the folding region 164 be conformal to the chamfer R. Furthermore, since the two support frames 140A, 140B are close to each other, the section of the second protection layer 160 located between the two support frames 140A, 140B covers most of the first side walls 142A, 142B of the two support frames 140A, 140B. In other words, a portion of the folding region 164 of the second protection layer 160 that is clamped between the two support frames 140A, 140B has a profile similar to the two first side walls 142A, 142B of the two support frames 140A, 140B. A portion of the folding region 164 of the two protection layer 160 underlying the two support frames 140A, 140B expand toward two sides (left side and right side) and forms an arc-shaped bending portion that has a folding width W1. The folding width W1 is greater than the gap G between the two electronic ink layers 130A, 130B, and is greater than a distance D1 between the two support frames 140A, 140B at the unfolded state.

Similarly, since the array substrate 120 is located above the second protection layer 160, and is overlapped with the second protection layer 160. Therefore, the boundary between the two active regions 122A, 122B of the array substrate 120 and the folding region 124 is conformal to the chamfer R. A portion of the folding region 124 of the array substrate 120 that is clamped between the two support frames 140A, 140B has a profile similar to the two first side walls 142A, 142B of the two support frames 140A, 140B. A portion of the folding region 124 of the array substrate 120 underlying the two support frames 140A, 140B expand toward two sides (left side and right side) and forms an arc-shaped bending portion.

Accordingly, since each of the two side walls 142A, 142B of the two support frames 140A, 140B has a chamfer R in a range from 0.5 mm to 1 mm, the radius of bending of the two electronic ink layers 130A, 130B, the array substrate 120, and the second protection layer 160 may be reduced. Furthermore, the gap G between the two electronic ink layers 130A, 130B can be reduced through the adhesive layers 170A, 170B that are conformal to the chamfers R, and it is beneficial for shielding the array substrate 120 underlying the two electronic ink layers 130A, 130B.

Similarly, since the first protection layer 150 is located above the two electronic ink layers 130A, 130B, and the two flat regions 152A, 152B of the first protection layer 150 are overlapped with the two electronic ink layers 130A, 130B. Therefore, the boundary between the two flat regions 152A, 152B of the first protection layer 150 and the folding region 154 is conformal to the chamfer R. The folding region 154 of the first protection layer 150 surrounds the two edges 132A, 132B of the two electronic ink layers 130A, 130B and is in contact with a portion of the folding region 124 of the array substrate 120.

Accordingly, since each of the two side walls 142A, 142B of the two support frames 140A, 140B has a chamfer R in a range from 0.5 mm to 1 mm, the radius of bending of the two electronic ink layers 130A, 130B, and the first protection layer 150 may be reduced. Therefore, the surface 100T formed by the two flat regions 152A, 152B of the first protection layer 150 may be more close to a continuous plane to improve the quality of splicing.

Figure 4:
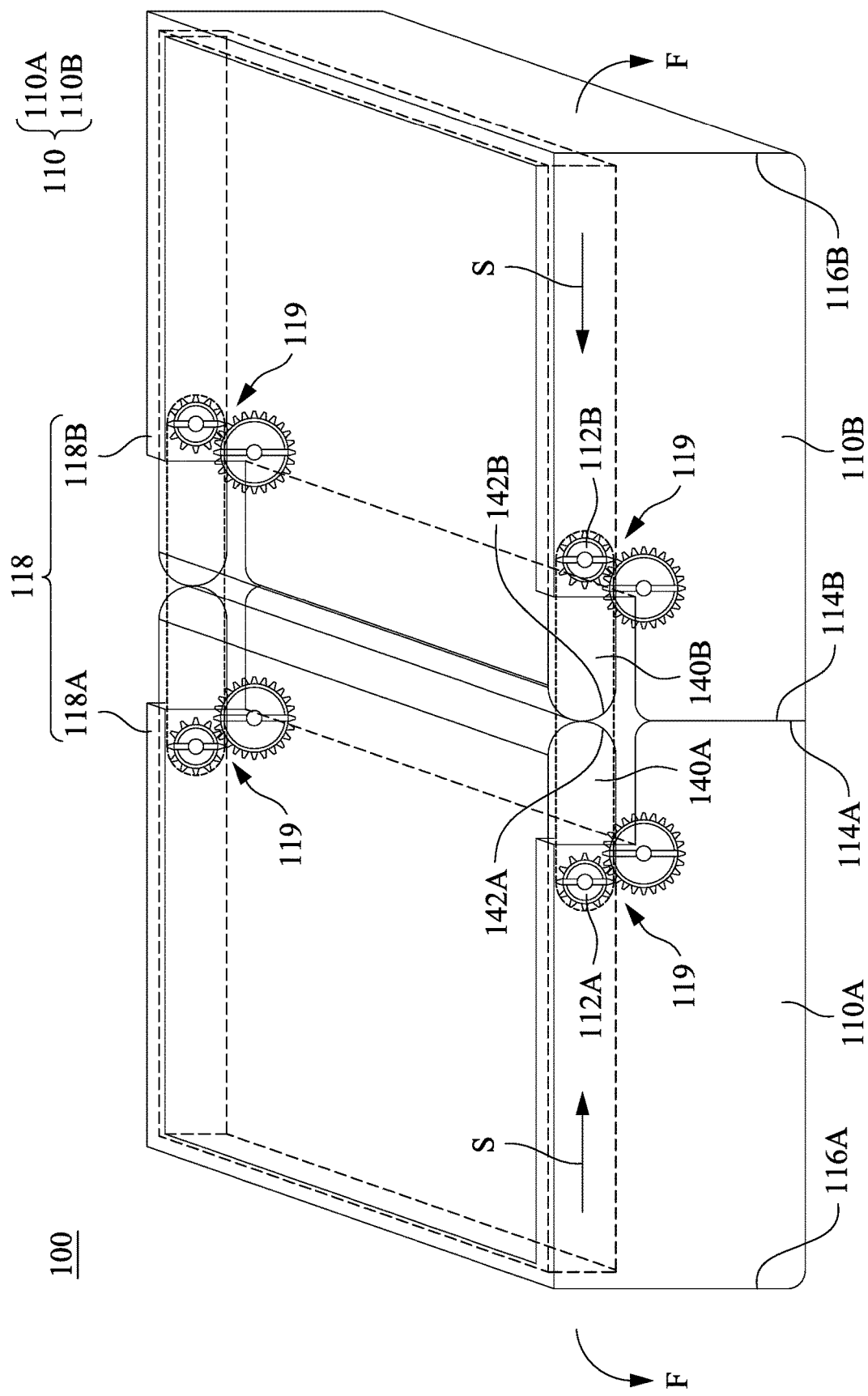
FIG. 4 is a perspective view of the display device in FIG. 1, and the array substrate and the two electronic ink layers are omitted.

FIG. 4 is a perspective view of the display device 100 in FIG. 2, and the array substrate 120 and the two electronic ink layers 130A, 130B are omitted. Reference is made to FIG. 2 and FIG. 4. Specifically, the housing 110 includes two cases 110A, 110B, and the two cases 110A, 110B respectively have rotation axes 112A, 112B. The housing 110 has a sliding groove set 118 configured inside the housing 110, and the two support frames 140A, 140B are slidably configured on the sliding groove set 118 of the housing 110. The two cases 110A, 110B have two first side walls 114A, 114B adjacent to each other and two second side walls 116A, 116B away from each other. The sliding groove set 118 includes two sliding grooves 118A, 118B. The two sliding grooves 118A, 118B are respectively sildably connected with the two support frames 140A, 140B and configured around the two cases 110A, 110B to surround the display region DR, and are substantially overlapped with the periphery region PR of the display device 100. The two cases 110A, 110B and the two sliding grooves 118A, 118B are connected through the hinge structure 119.

Figure 5:
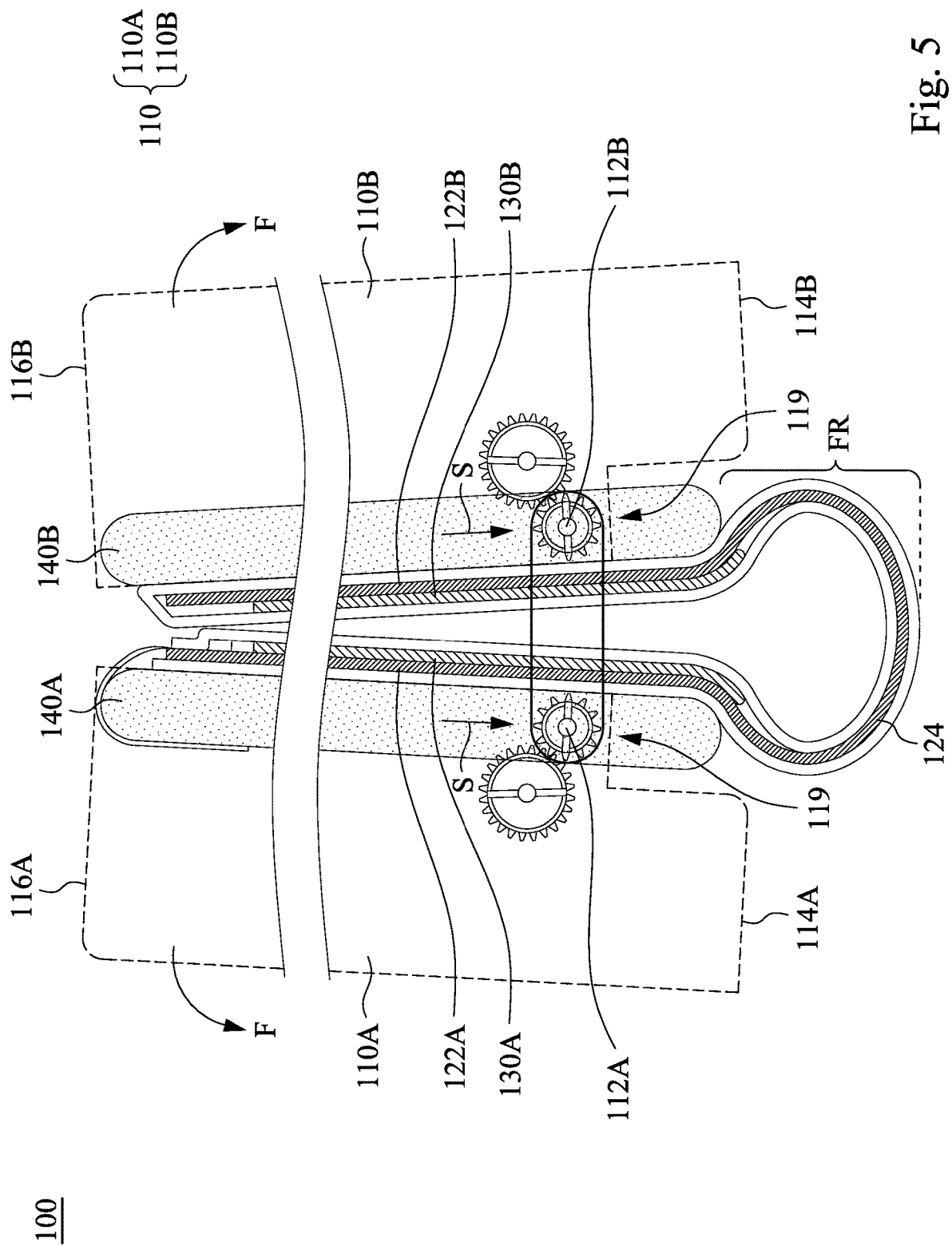
FIG. 5 is a cross-sectional view of the display device in FIG. 2 at a folded state.

FIG. 5 is a cross-sectional view of the display device 100 in FIG. 2 at a folded state. When the display device 100 is at the folded state, the cases 110A, 110B are arranged side by side but are not parallel with each other. The distance between the second side walls 116A, 116B of the cases 110A, 110B is smaller than the distance between the first side walls 114A, 114B of the cases 110A, 110B. The two support frames 140A, 140B are arranged side by side between the cases 110A, 110B. The two active regions 122A, 122B of the array substrate 120 are arranged side by side between the two support frames 140A, 140B. The two electronic ink layers 130A, 130B are arranged side by side between the two active regions 122A, 122B of the array substrate 120.

Figure 6:
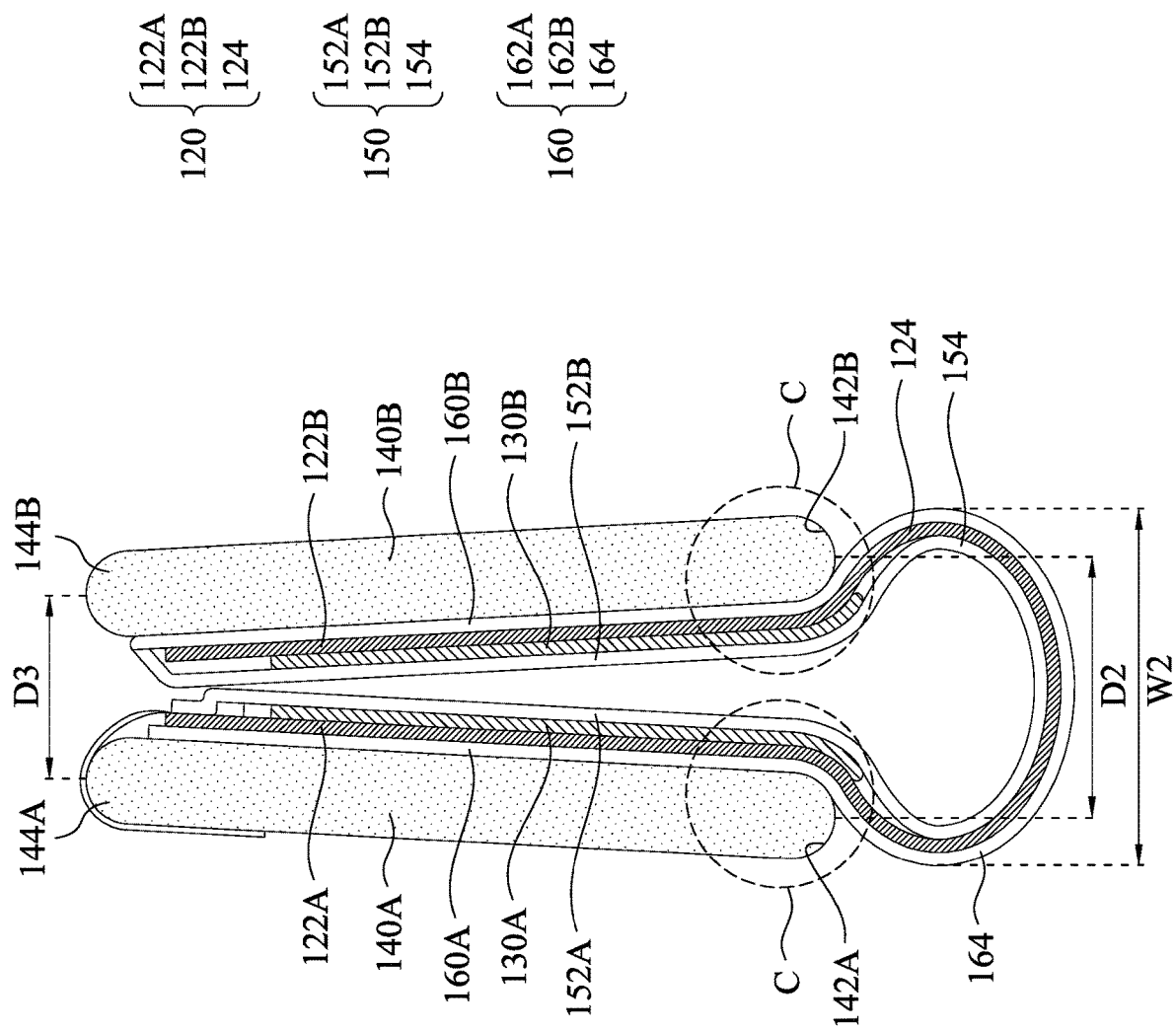
FIG. 6 is a cross-sectional view of the display device in FIG. 3 at the folded state.

FIG. 6 is a cross-sectional view of the display device 100 in FIG. 3 at the folded state. The support frames 140A, 140B respectively have second side walls 144A, 144B opposite to the first side walls 142A, 142B. When the display device 100 is at the folded state, the distance D2 between the two first side walls 142A, 142B of the two support frames 140A, 140B is greater than the distance D3 between the second side walls 144A, 144B of the two support frames 140A, 140B. Reference is made to FIG. 3 and FIG. 6, when the display device 100 is at the unfolded state, since the two support frames 140A, 140B are close to each other, the distance D1 between the first side walls 142A, 142B of the support frames 140A, 140B is substantially equal to twice of a sum of thicknesses of the first protection layer 150, the second protection layer 160, and the array substrate 120. However, when the display device 100 is at the folded state, the distance the distance D2 between the two first side walls 142A, 142B of the two support frames 140A, 140B is greater than the distance D1. Therefore, as shown in FIG. 6, the folding region 154 of the first protection layer 150, the folding region 164 of the second protection layer 160, and the folding region 124 of the array substrate 120 have no bending section as shown in FIG. 3. A portion of the folding region 164 of the second protection layer 160 underlying the two support frames 140A, 140b expand toward two sides (left side and right side) and has a folding width W2, and the folding width W2 is greater than the width W1. As a result, the stress suffered by the portion of the first protection layer 150, the second protection layer 160, and the array substrate 120 adjacent to the two support frames 140A, 140B can be reduced (as shown in the region in the dashed frame C) to prevent the first protection layer 150, the second protection layer 160, and the array substrate 120 from damage due to bending, thereby extend the life time of the display device 100.

Furthermore, the first protection layer 150, the second protection layer 160, the two electronic ink layers 130A, 130B, and the array substrate 120 can be conformal to the chamfer R through the two adhesive layers 170A, 170B that are conformal to the chamfer R. Therefore, peeling of the display device 100 can be avoided during the folding process to prevent the aforementioned layers separated from the two support frames 140A, 140B.

Figure 7:
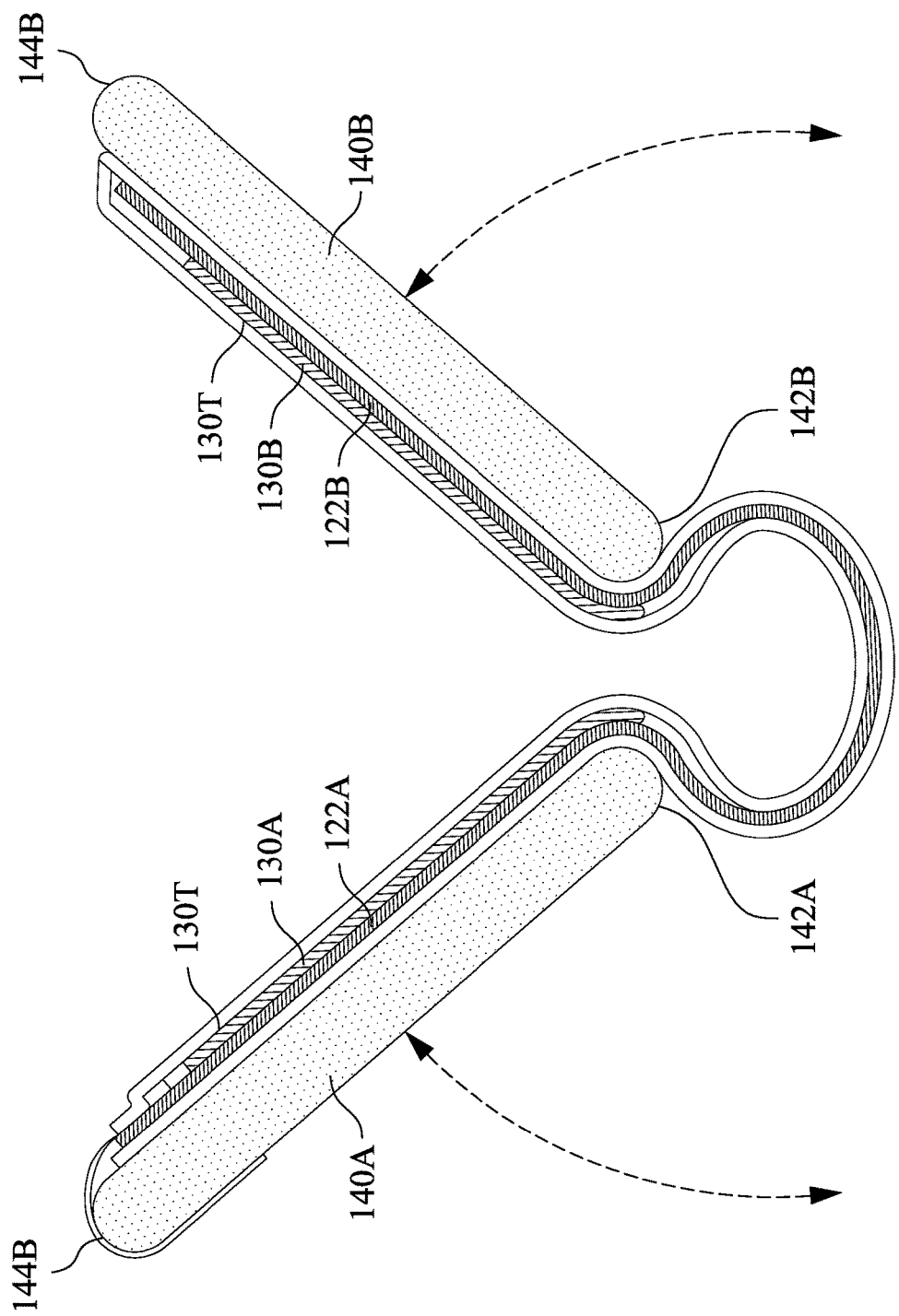
FIG. 7 is a cross-sectional view of a display device at an intermediate state between the folded state and the unfolded state according to another embodiment of the present embodiment.

FIG. 7 is a cross-sectional view of a display device 100 at an intermediate state between the folded state and the unfolded state according to another embodiment of the present embodiment. For example, the display device 100 can be expand from the folded state as shown in FIG. 6 to the unfolded state as shown in FIG. 7, and it can be continuously expand to a unfolded state as shown in FIG. 3, and vice versa.

Reference is made to FIG. 5 and FIG. 6, during the expansion process of the display device 100 from the folded state shown in FIG. 6 to the unfolded state shown in FIG. 7, as shown by the arrow F in FIG. 5, the two cases 110A, 100B are respectively rotate along the rotation axes 112A, 112B in the opposite direction and are away from each other. At the same time, as shown by the arrow S in FIG. 5, the hinge structure 119 takes the two support frames 140A, 140B slide respectively toward the folding region FR, and makes the two second side walls 144A, 144б of the two support frames 140A, 140б away from each other.

Reference is made to FIG. 6 and FIG. 7, during the process of the two support frames 140A, 140B respectively slide toward the folding region FR, the first side walls 142A, 142B of the two support frames 140A, 140B are close to each other and the distance D2 is reduced, and the second side walls 144A, 144B of the two support frames 140A, 140B are away from each other. The two support frames 140A, 140B respectively take the edges 132A, 132B of the two electronic ink layers 130A, 130B close to each other, and make the surface 130T of the two electronic ink layers 130A, 130б opposite to the array substrate 120 exposed to be the display screen.

Reference is made to FIG. 3 and FIG. 4, during the expansion process of the display device 100 from the folded state shown in FIG. 7 to the unfolded state shown in FIG. 3, as shown by the arrow F in FIG. 4, the two cases 110A, 110б respectively rotate along the rotation axes 112A, 112B continuously. At the same time, as shown by the arrow S in FIG. 4, the hinge structure 119 takes the two support frames 140A, 140B slide respectively toward the folding region FR till the two first side walls 142A, 142B are close to each other, and makes the two support frames 140A, 140B expand to be co-planar. At the same time, the edges 132A, 132B of the two electronic ink layers 130A, 130B are close to each other and are spliced together to form the display region DR, thereby forming the unfolded state as shown in FIG. 3.

Figure 8:
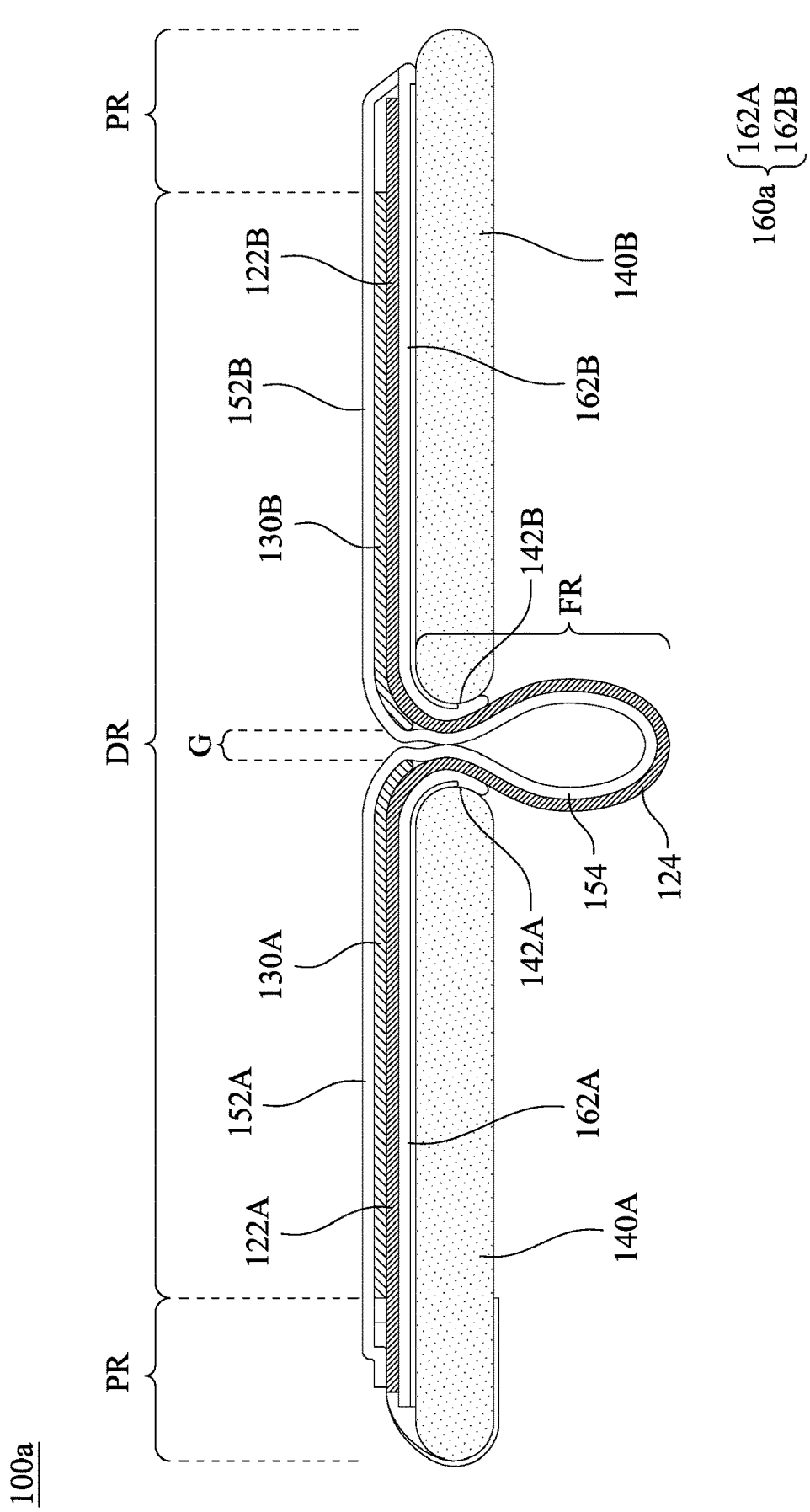
FIG. 8 is a cross-sectional view of a display device at the unfolded state according to another embodiment of the present embodiment.

FIG. 8 is a cross-sectional view of a display device 100a at the unfolded state according to another embodiment of the present embodiment. The display device 100a is substantially the same as the display device 100, the difference is that the second protection layer 160a of the display device 100a has two flat regions 162A, 162B, and has no folding region 164. In other words, the two flat regions 162A, 162B of the second protection layer 160a are separated from each other. In this way, the thickness of the layers of the folding region FR can be reduced to achieve the advantage of the folding region thinning. Furthermore, when the display device 100a is folded, the stress suffered by the portion of the first protection layer 150 and the array substrate 120 adjacent to the two support frames 140A, 140B can be reduced.

Figure 9:
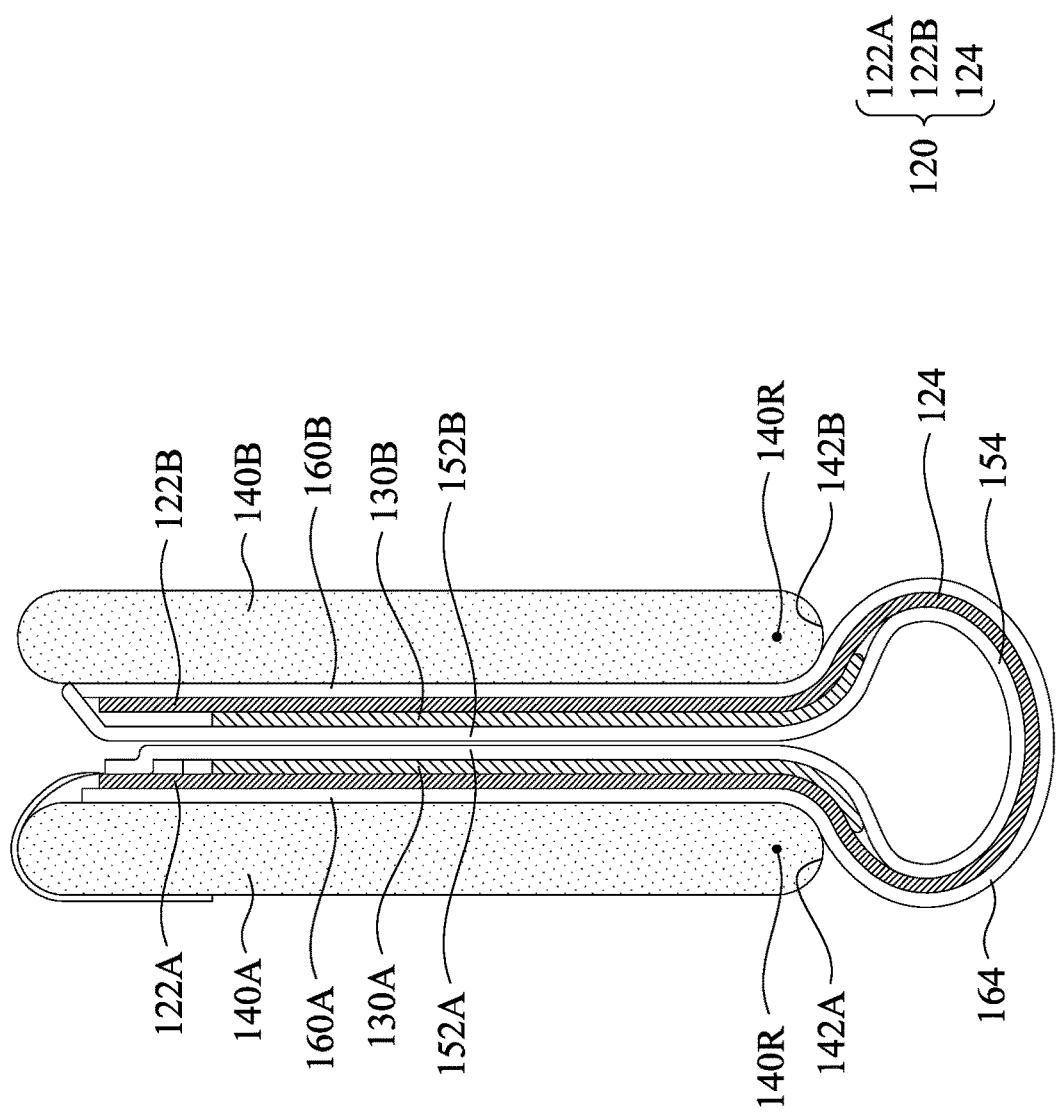
FIG. 9 is a cross-sectional view of a display device at the folded state according to another embodiment of the present embodiment.

FIG. 9 is a cross-sectional view of a display device 100 at the folded state according to another embodiment of the present embodiment. When the display device 100b is at the folded state, the two electronic ink layers 130A, 130B are located between the two active regions 122A, 122B of the array substrate 120, and the two electronic ink layers 130A, 130B are substantially parallel with each other. In the present embodiment, the two support frames 140A, 140B have rotation axes 140R. The two flat regions 152A, 152B of the first protection layer 150, and the two flat regions 162A, 162B of the second protection layer 160 are substantially parallel with each other. The two active regions 122A, 122B of the array substrate 120 are also substantially parallel with each other. In other words, during the process of folding or unfolding of the display device 100b, there is no need for the two support frames 140A, 140B to slide in the sliding groove set 118 of the housing 110 (see FIG. 4). As shown in FIG. 9, the rotation axes 140R of the two support frames 140A, 140B rotate in situ. In other words, the distance between the two first side walls 142A, 142B of the support frames 140A, 140B are substantially the same during the process of the folding and unfolding, thereby reducing the volume of the display device 100b at the folding state.

As described above, when the distance between the two first side walls 142A, 142B of the support frames 140A, 140B is increased, the stress suffered by the portion of the first protection layer 150, the second protection layer 160, and the two first side walls 142A, 142B of the support frames 140A, 140B can be reduced. Therefore, in some embodiments, the stress suffered by the entire structure of the first protection layer 150, the second protection layer 160, and the two first side walls 142A, 142B of the support frames 140A, 140B can be reduced by reducing the thickness of the first protection layer 150 and the second protection layer 160, such that the rotation axes 140R of the two support frames 140A, 140B can rotate in situ.

In some embodiment, the second protection layer 160 of the display device 100b may have similar structures as the display device 100a in FIG. 8. In other words, the display device 100b may reduce the stress suffered by the portion of the first protection layer 150, the second protection layer 160, and the array substrate 120 adjacent to the two first side walls 142A, 142B of the two support frames 140A, 140B by omitting the folding region 164 of the second protection layer 160a.

Figure 10:
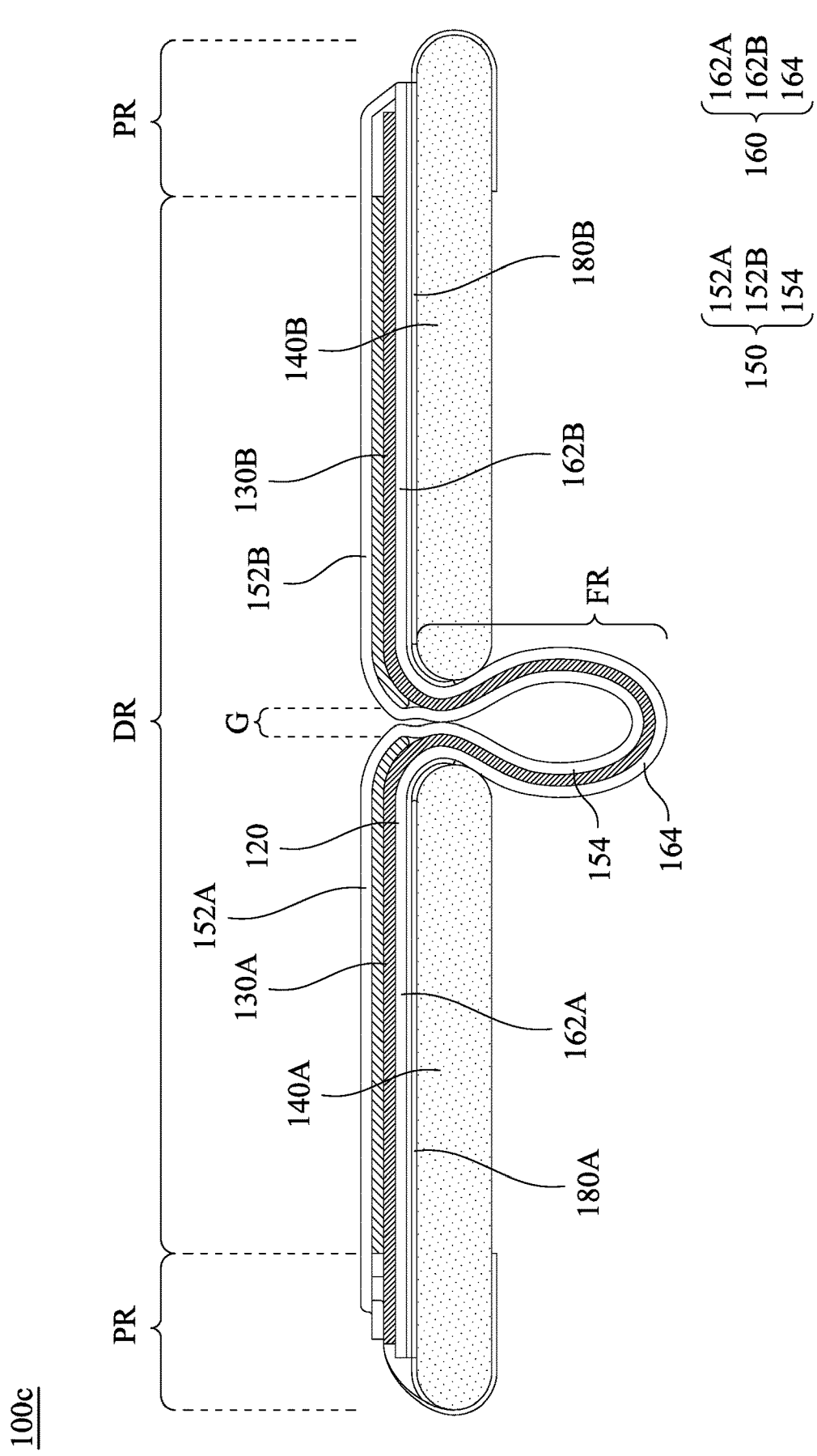
FIG. 10 is a cross-sectional view of a display device at the unfolded state according to another embodiment of the present embodiment.

FIG. 10 is a cross-sectional view of a display device 100c at the unfolded state according to another embodiment of the present embodiment. The display device 100c is substantially the same as the display device 100 in FIG. 3, the difference is that the display device 100c further includes two writing sensor 180A, 180B located below the array substrate 120. In the present embodiment, the two writing sensor 180A, 180B are respectively overlapped with the two flat regions 152A, 152B of the first protection layer 150, the two flat regions 162A, 162B of the second protection layer 160, and the two active regions 122A, 122B of the array substrate 120. In other words, the projection of the two writing sensor 180A, 180B on the two support frames 140A, 140B are also overlapped with the display region DR. Since the two writing sensor 180A, 180B are not overlapped with the folding region FR, and the two writing sensor 180A, 180B are taken by the two support frames 140A, 140B to be spliced as a writing region overlapping with the display region DR. Therefore, the two writing sensor 180A, 180B will not be bent. As such, degradation of the precision of the writing function due to long-time bending can be avoided, and the malfunction of the two writing sensor 180A, 180B caused by bending can also be prevented.

In some other embodiment, the writing sensor can be continuously overlapped with the array substrate 120, that is, the writing sensor may be overlapped with the display region DR and the folding region FR. However, since the portion of the writing sensor that is overlapped with the display region DR will not be bent, and the portion of the writing sensor overlapping with the folding region FR will be bent to be located below the two support frames 140A, 140B but not expand to the display region DR, degradation of the precision of the writing function due to long-time bending can be avoided, and the malfunction of the writing sensor caused by bending can also be prevented.

Figure 11:
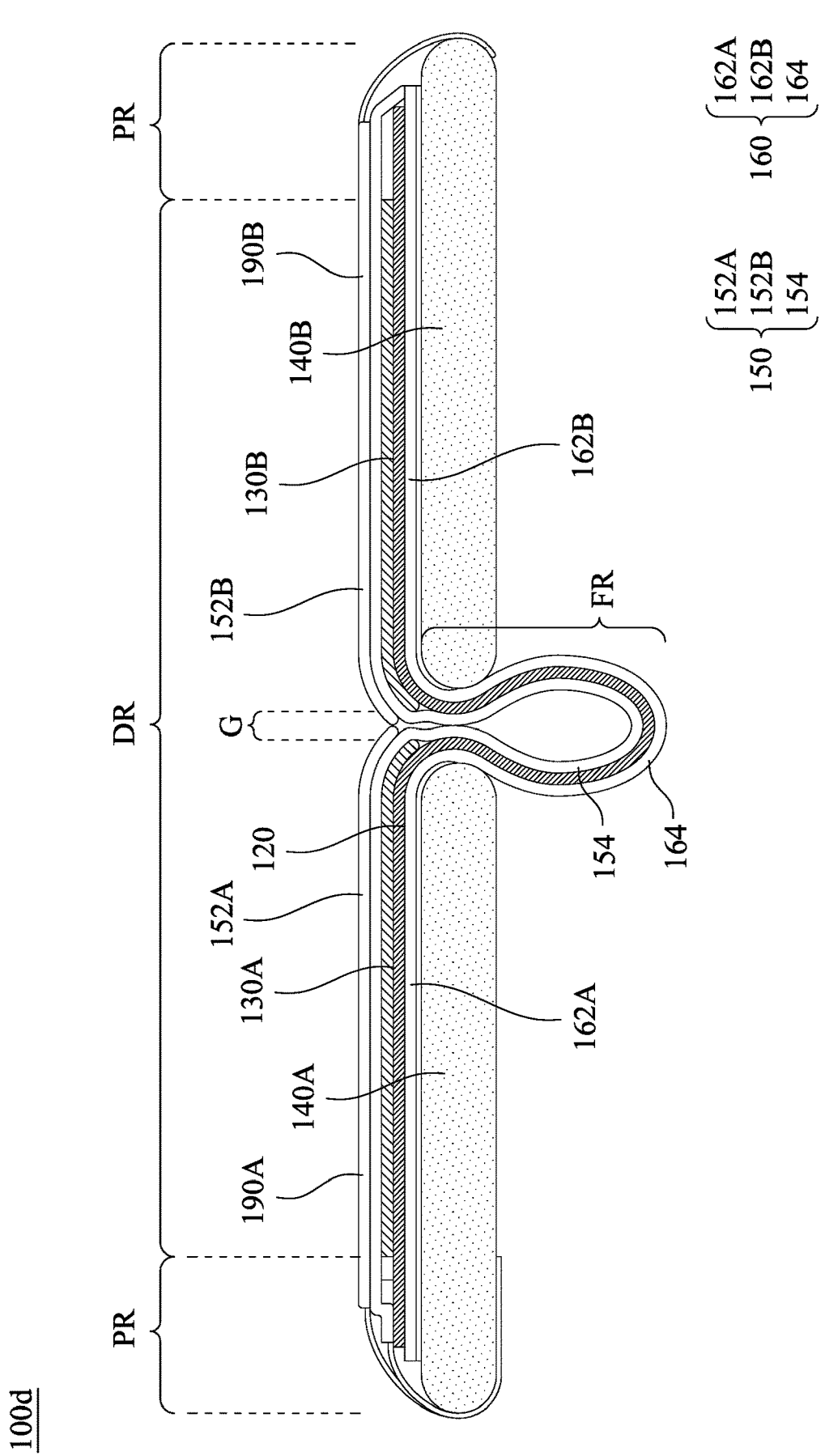
FIG. 11 is a cross-sectional view of a display device at the unfolded state according to another embodiment of the present embodiment.

FIG. 11 is a cross-sectional view of a display device 100d at the unfolded state according to another embodiment of the present embodiment. The display device 100d is substantially the same as the display device 100 in FIG. 3, the difference is that the display device 100d further includes two touch sensing layers 190A, 190B located above the two electronic ink layers 130A, 130B. In the present embodiment, the two touch sensing layers 190A, 190B are respectively overlapped with the two flat regions 152A, 152B of the first protection layer 150, the two flat regions 162A, 162B of the second protection layer 160, and the two active regions 122A, 122B of the array substrate 120. In other words, the projection of the two touch sensing layer 190A, 190b on the two support frames 140A, 140B are also overlapped with the display region DR (see FIG. 2). Since the two touch sensing layer 190A, 190B are not overlapped with the folding region FR, and the two touch sensing layer 190A, 190B are taken by the two support frames 140A, 140B to be spliced as a touch region overlapping with the display region DR. Therefore, the two touch sensing layers 190A, 190B will not be bent. As such, degradation of the precision of the touch function due to long-time bending can be avoided, and the malfunction of the t two touch sensing layers 190A, 190B caused by bending can also be prevented.

In some other embodiment, the touch sensing layers can be continuously overlapped with the array substrate 120, that is, the touch sensing layers may be overlapped with the display region DR and the folding region FR. However, since the portion of the touch sensing layers that is overlapped with the display region DR will not be bent, and the portion of the touch sensing layers overlapping with the folding region FR will be bent to be located below the two support frames 140A, 140B but not expand to the display region DR, degradation of the precision of the touch function due to long-time bending can be avoided, and the malfunction of the touch sensing layers caused by bending can also be prevented.

Figure 12:
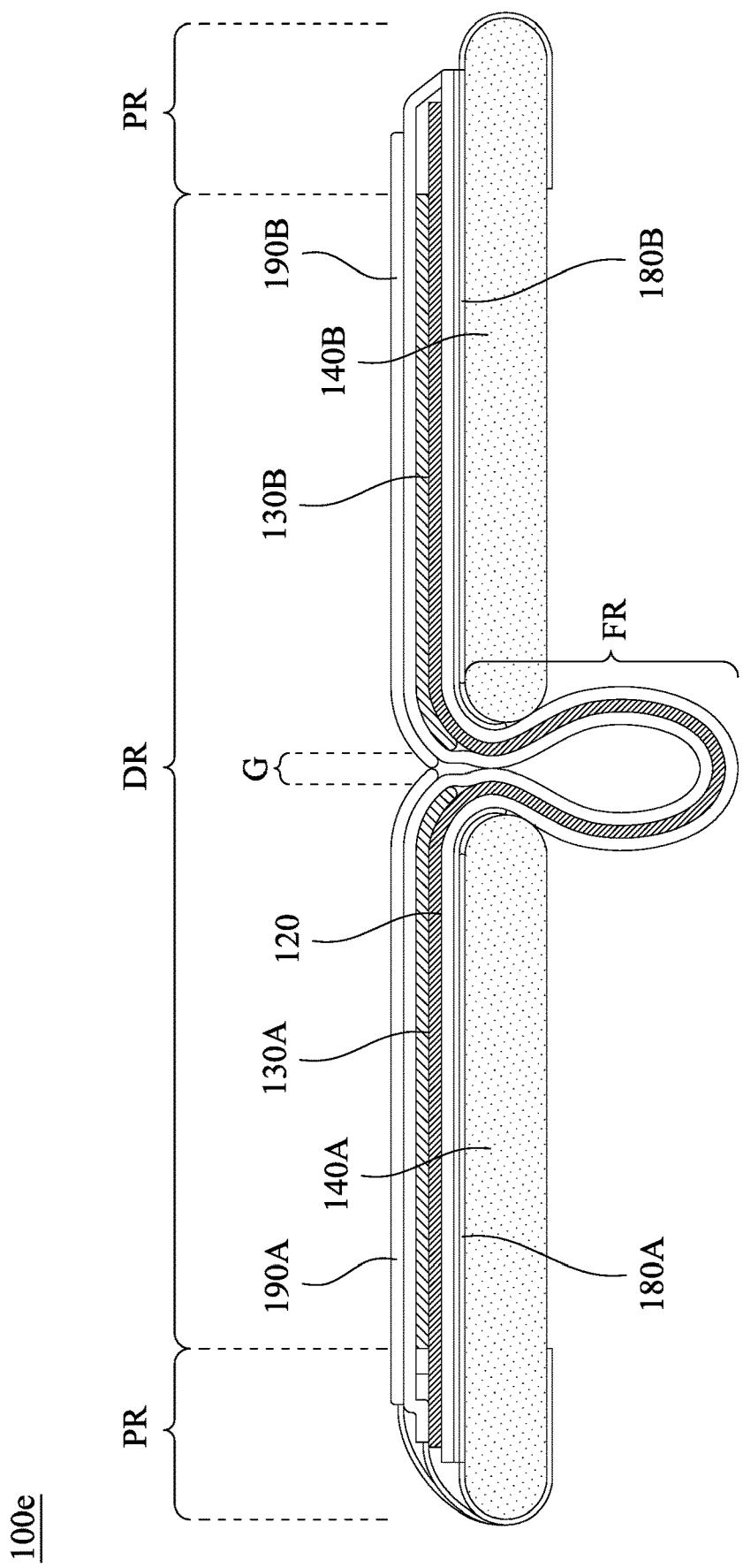
FIG. 12 is a cross-sectional view of a display device at the unfolded state according to another embodiment of the present embodiment.

FIG. 12 is a cross-sectional view of a display device 100e at the unfolded state according to another embodiment of the present embodiment. The display device 100e can be considered as a combination of the display device 100c and the display device 100d. The display device 100e may has a single layer of the writing sensor or two separate layers of the writing sensor 180A, 180B and has a single layer of the touch sensing layer or two separate layers of the touch sensing layer 190A, 190B simultaneously. Therefore, the display device 100e has similar advantages as the display device 100, and a description is not repeated thereafter.

As mentioned above, the display device of the present embodiment may drive the two electronic ink layers 130A, 130B by the driving circuit on the array substrate 120 simultaneously, and splice the two electronic ink layers 130A, 130B to form the display region DR at the unfolded state. Therefore, there is no need to use two array substrates, and it can avoid increasing the fabrication cost. Furthermore, since the two electronic ink layers 130A, 130B are not overlapped with the folding region FR, the material for the two electronic ink layers 130A, 130B used for display will not be bent. As a result, the arc deformation due to material creep after long time bending can be avoided, and the display quality of the display device can be improved.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A display device, comprising:
   an array substrate comprising two active regions and a folding region connecting the two active regions, wherein the two active regions are located at two opposite sides of the folding region;
   two electronic ink layers respectively located on the two active regions, wherein the folding region of the array substrate is located below a gap between the two electronic ink layers; and
   a second protection layer, wherein the array substrate is located between the two electronic ink layers and the second protection layer;
   wherein when the display device is at an unfolded state, two edges of the two electronic ink layers close to the gap are adjacent to each other, and when the display device is at a folded state, the two electronic ink layers are located between the two active regions of the array substrate.

2. The display device of claim 1, further comprising:
   a first protection layer covering the array substrate and the two electronic ink layers.

3. The display device of claim 2, wherein the first protection layer comprises a folding region, and wherein when the display device is at the unfolded state, the folding region of the first protection layer is located below the two electronic ink layers and the two active regions of the array substrate.

4. The display device of claim 2, wherein the first protection layer comprises two flat regions respectively overlapped with the two electronic ink layers, and wherein when the display device is at the unfolded state, the two flat regions are in contact with each other and form a continuous surface.

5. The display device of claim 1, wherein the second protection layer comprises two flat regions respectively overlapped with the two electronic ink layers, and the two flat regions are separated from each other.

6. The display device of claim 1, wherein the second protection layer comprises two flat regions and a folding region connecting the two flat regions, the two flat regions are respectively overlapped with the two electronic ink layers, and wherein when the display device is at the unfolded state, the folding region of the second protection layer is located below the two flat regions of the second protection layer.

7. The display device of claim 1, further comprising:
   a first protection layer comprising a folding region; and
   a second protection layer comprising a folding region, wherein the folding region of the first protection layer is overlapped with the folding region of the second protection layer.

8. The display device of claim 1, further comprising:
   two support frames located above the array substrate and respectively overlapping the two active regions of the array substrate, wherein when the display device is at the unfolded state, the two first side walls of the two support frames are adjacent to each other, and the folding region of the array substrate is located below the two support frames.

9. The display device of claim 8, wherein when the display device is at the folded state, the two active regions of the substrate array and the two electronic ink layers are located between the two support frames.

10. The display device of claim 8, wherein each of the two first side walls of the two support frames has a chamfer in a range from 0.5 mm to 1 mm.

11. The display device of claim 10, further comprising:
two adhesive layers respectively located between the second protection layer and the two support frames, and the two adhesive layers are respectively conformal to the two chamfers of the two first side walls of the two support frames.

12. The display device of claim 10, wherein the two edges of the two electronic ink layers are respectively conformal to the two chamfers of the two first side walls of the two support frames.

13. The display device of claim 10, wherein each of the two support frames has a second side wall facing the first side wall, and wherein when the display device is at the folded state, a distance between the two first side walls is greater than a distance between the two second side walls.

14. The display device of claim 8, further comprising:
a housing comprising a sliding groove set, wherein the two support frames are slidably disposed on the sliding groove set of the housing.

15. The display device of claim 1, wherein when the display device is at the folded state, the two electronic ink layers are substantially parallel with each other.

16. The display device of claim 1, further comprising:
at least one writing sensor located below the array substrate.

17. The display device of claim 16, wherein a number of the at least one writing sensor is two, and the two writing sensors are respectively overlap with the two active regions of the array substrate.

18. The display device of claim 1, further comprising:
at least one touch sensing layer located above the two electronic ink layers.

19. The display device of claim 18, wherein a number of the at least one touch sensing layer is two, and the two touching sensing layers are respectively overlap with the two active regions of the array substrate.

* * * * *